US010128869B2

(12) United States Patent
Tate et al.

(10) Patent No.: US 10,128,869 B2
(45) Date of Patent: Nov. 13, 2018

(54) EFFICIENT CONVERGENCE IN ITERATIVE DECODING

(71) Applicant: Apple Inc., Cupertino, CA (US)

(72) Inventors: Yonathan Tate, Kfar Saba (IL); Moti Teitel, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 221 days.

(21) Appl. No.: 15/156,356

(22) Filed: May 17, 2016

(65) Prior Publication Data

US 2017/0338838 A1  Nov. 23, 2017

(51) Int. Cl.
*H03M 13/00* (2006.01)
*H03M 13/11* (2006.01)

(52) U.S. Cl.
CPC ...... *H03M 13/116* (2013.01); *H03M 13/1108* (2013.01); *H03M 13/1111* (2013.01); *H03M 13/1128* (2013.01)

(58) Field of Classification Search
CPC .......... H03M 13/116; H03M 13/1128; H03M 13/255; H03M 13/3746; H03M 13/45
USPC ................................................. 714/800–805
See application file for complete search history.

(56) References Cited

U.S. PATENT DOCUMENTS

| | | | |
|---|---|---|---|
| 6,148,049 A * | 11/2000 | Hein ..................... | H04N 21/242 370/509 |
| 6,757,122 B1 | 6/2004 | Kuznetsov et al. | |
| 7,539,920 B2 | 5/2009 | Choi et al. | |
| 7,765,453 B2 | 7/2010 | Duggan | |
| 8,291,283 B1 * | 10/2012 | Rad ..................... | H03M 13/036 714/752 |
| 8,291,298 B2 | 10/2012 | Lo et al. | |
| 8,359,522 B2 | 1/2013 | Gunnam et al. | |
| 8,392,789 B2 | 3/2013 | Biscondi et al. | |
| 8,392,795 B2 | 3/2013 | Ueng et al. | |

(Continued)

FOREIGN PATENT DOCUMENTS

| | | |
|---|---|---|
| CN | 102111241 A | 6/2011 |
| CN | 103905063 A | 7/2014 |
| WO | 2014179502 A1 | 11/2014 |

OTHER PUBLICATIONS

Cui et al., "Efficient Decoder Design for High-Throughput LDPC decoding", IEEE Asia Pacific Conference on Circuits and Systems, pp. 1640-1643, Nov. 2008.

(Continued)

*Primary Examiner* — Albert Decady
*Assistant Examiner* — Osman M Alshack
(74) *Attorney, Agent, or Firm* — D.Kligler IP Services Ltd.

(57) ABSTRACT

A decoder includes one or more Variable-Node Processors (VNPs) that hold respective variables, and logic circuitry. The logic circuitry is configured to decode a code word of an Error Correction Code (ECC), which is representable by a set of check equations, by performing a sequence of iterations such that each iteration involves processing of at least some of the variables, to hold one or more auxiliary equations derived from the check equations, so that a number of the auxiliary equations is smaller than a number of the check equations, to evaluate the auxiliary equations, during the sequence of iterations, using the variables, and, in response to detecting that the variables satisfy the auxiliary equations, to terminate the sequence of iterations and output the variables as the decoded code word.

16 Claims, 3 Drawing Sheets

(56) References Cited

U.S. PATENT DOCUMENTS

| | | | |
|---|---|---|---|
| 8,473,806 B1 | 6/2013 | Rad et al. | |
| 8,601,352 B1 | 12/2013 | Anholt et al. | |
| 8,645,810 B2 | 2/2014 | Sharon et al. | |
| 8,661,326 B1 | 2/2014 | Li et al. | |
| 8,839,077 B2 | 9/2014 | Ueng et al. | |
| 9,252,813 B2* | 2/2016 | Wajcer | H03M 13/253 |
| 2006/0031737 A1* | 2/2006 | Chugg | H03M 13/095 |
| | | | 714/755 |
| 2008/0104474 A1 | 5/2008 | Gao et al. | |
| 2009/0172493 A1 | 7/2009 | Park et al. | |
| 2010/0107030 A1 | 4/2010 | Graef | |
| 2010/0153819 A1 | 6/2010 | Ueng et al. | |
| 2011/0191650 A1 | 8/2011 | Yokokawa | |
| 2011/0252286 A1* | 10/2011 | Li | H03M 13/1114 |
| | | | 714/755 |
| 2012/0079340 A1 | 3/2012 | Gunnam et al. | |
| 2013/0031440 A1* | 1/2013 | Sharon | G06F 11/1012 |
| | | | 714/758 |
| 2013/0124590 A1 | 5/2013 | Gunnam et al. | |
| 2014/0223255 A1 | 8/2014 | Lu et al. | |
| 2015/0249471 A1 | 9/2015 | Yen et al. | |
| 2016/0020783 A1* | 1/2016 | Yang | H03M 13/114 |
| | | | 360/53 |
| 2016/0094245 A1 | 3/2016 | Landau et al. | |
| 2016/0277035 A1* | 9/2016 | Liu | H03M 13/114 |
| 2017/0149445 A1* | 5/2017 | Liu | H03M 13/1111 |

OTHER PUBLICATIONS

Hocevar, D.E., "LDPC code construction with flexible hardware implementation," IEEE International Conference on Communications, ICC '03, p. 2708-2712, May 2003.

U.S. Appl. No. 14/499,284 Office Action dated Aug. 11, 2016.

* cited by examiner

EFFICIENT CONVERGENCE IN ITERATIVE DECODING

TECHNICAL FIELD

Embodiments described herein relate generally to Error Correction Coding (ECC), and particularly to methods and systems for ECC decoding.

BACKGROUND

Some types of error correction codes, such as Low Density Parity Check (LDPC) and Quasi-Cyclic (QC)-LDPC codes, are commonly decoded using iterative decoding processes. Various schemes for iterative decoding are known in the art. For example, in U.S. Pat. No. 8,645,810, whose disclosure is incorporated herein by reference, a termination indication is computed during an iteration of an iterative decoding of a representation of a codeword according to a schedule. The termination indication is tested to see if the decoding has converged or is not likely to converge. The testing of the termination indication shows convergence or lack of likelihood thereof even if a codeword bit estimate was flipped during an immediately preceding traversal of the schedule. Preferably, the termination indication includes an error correction syndrome weight, a zero value whereof indicates convergence, and the computing of the termination indication includes, in response to the flipping of a codeword bit estimate, flipping the error correction syndrome bits that are influenced by that codeword bit estimate.

U.S. Pat. No. 8,661,326, whose disclosure is incorporated herein by reference, describes a decoding system including a low density parity check (LDPC) processing module and a termination module. The LDPC processing module is configured to receive a test codeword based on a codeword received over a communications channel, and to perform, for each row of a parity-check matrix, a processing operation on the test codeword. The LDPC processing module is configured to, once the processing operations have been performed for all the rows, repeat the processing operations. The termination module is configured to monitor progress of the LDPC processing module and selectively generate a termination signal in response to the test codeword being a valid codeword according to the parity-check matrix. The LDPC processing module is further configured to terminate the processing operations in response to generation of the termination signal.

U.S. Patent Application Publication 2015/0249471, whose disclosure is incorporated herein by reference, describes a method and a decoder for early terminating decoding processes of serial concatenated coding. The method includes the steps of: A) providing a codeword, encoded by a first coding and a second coding sequentially, decoding of the second coding needing iterative calculations for syndromes; B) setting a maximum syndrome weight; C) processing decoding of the second coding for the codeword; D) terminating decoding of the second coding if a number of the iterative calculations reaches a preset number or a syndrome weight of one iterative calculation is equal to or smaller than the maximum syndrome weight, otherwise repeating step C to step D; and E) decoding the first coding for the codeword.

SUMMARY

An embodiment that is described herein provides a decoder, including one or more Variable-Node Processors (VNPs) that hold multiple values of respective variables, and logic circuitry. The logic circuitry is configured to decode a code word of an Error Correction Code (ECC), which is representable by a set of check equations, by performing a sequence of iterations such that each iteration involves processing of at least some of the variables, to hold one or more auxiliary equations derived from the check equations, so that the number of the auxiliary equations is smaller than the number of the check equations, to evaluate the auxiliary equations, during the sequence of iterations, using the variables, and, in response to detecting that the variables satisfy the auxiliary equations, to terminate the sequence of iterations and output the variables as the decoded code word.

In some embodiments, the one or more auxiliary equations are derived from the check equations so that every code word of the ECC satisfies each of the auxiliary equations. In other embodiments, the logic circuitry is configured to hold an auxiliary equation including a linear combination of two or more of the check equations. In yet other embodiments, the logic circuitry is configured to verify that the variables satisfy the auxiliary equations regardless of whether or not the variables satisfy the check equations.

In an embodiment, the ECC includes a Quasi-Cyclic (QC)-Low Density Parity Check (LDPC) code whose check equations are organized in a parity-check matrix that includes multiple block rows of L-by-L sub-matrices, and the logic circuitry is configured to hold an auxiliary equation including a linear combination of two or more check equations that belong to different respective block rows. In another embodiment, the logic circuitry is configured to hold K auxiliary equations, and to falsely output the variables not holding a valid code word with a probability that is a non-increasing function of K. In yet another embodiment, the logic circuitry is configured to calculate an auxiliary syndrome corresponding to the auxiliary equations, and to detect that the variables satisfy the auxiliary equations by detecting that the auxiliary syndrome equals zero. In yet further another embodiment, the VNPs are configured to define the values of the variables in some Galois Field (GF), and the logic circuitry is configured to update the auxiliary syndrome based on a vector of recently updated variables.

In some embodiments, the code word is stored in a memory device, and the logic circuitry is configured to initialize the variables by receiving the code word from the memory device. In some embodiments, the code word is received in a communication signal, and the logic circuitry is configured to initialize the variables with the code word received in the communication signal.

There is additionally provided, in accordance with an embodiment that is described herein, a method, including receiving in a decoder, which holds multiple values of respective variables, a code word of an Error Correction Code (ECC), which is representable by a set of check equations. The code word is decoded by performing a sequence of iterations such that each iteration involves processing of at least some of the variables. One or more auxiliary equations are derived from the check equations and held, so that the number of the auxiliary equations is smaller than the number of the check equations. During the sequence of iterations, the auxiliary equations are evaluated using the variables, and in response to detecting that the variables satisfy the auxiliary equations, the sequence of iterations is terminated and the variables are output as the decoded code word.

DETAILED DESCRIPTION OF EMBODIMENTS

Overview

Some types of Error Correcting Codes (ECC), such as Low Density Parity Check (LDPC) codes, are represented by multiple check equations that are defined over multiple variables. Some iterative ECC decoders for such codes may be represented graphically using multiple check nodes corresponding to the check equations, and multiple variable nodes corresponding to the variables. In this representation, the variable node corresponding to a given variable is connected to the check nodes that correspond to the check equations in which the variable appears. In the description that follows the terms "variable nodes" and "variables" are used interchangeably.

A decoder of this sort, sometimes referred to as a message passing decoder, decodes the ECC by exchanging messages between check nodes and variable nodes that are connected to one another, in an attempt to converge to a state where the variables corresponding to the variable nodes hold a valid code word of the ECC. In decoding of practical LDPC codes, it may take on the order of 5-7 full scans over all check nodes and variable nodes to converge to a valid code word.

In principle, the decoder could detect convergence to a valid code word by checking whether the variables satisfy all the check equations, e.g., using dedicated hardware. The number of check equations, however, is typically very large, and therefore evaluating the entire set of check equations using dedicated hardware would increase the circuitry area and power consumption considerably. Alternatively, the decoder could re-scan all the check equations to evaluate one check equation at a time, but this approach would introduce full scan latency, decrease the decoding throughput and increase power consumption.

Embodiments of the present invention that are described herein provide improved methods and systems for fast and efficient convergence in iterative decoding. In the disclosed techniques, the decoding is regarded as converged when the variables satisfy a small number of auxiliary equations that are derived from the check equations. Evaluating the auxiliary equations instead of the original code's check equations is much more efficient, shortens the decoding latency and increases the decoding throughput while requiring only small circuitry area and low power consumption. Note that in the disclosed embodiments, the decoding terminates when the variables satisfy the auxiliary equations regardless of whether or not the variables satisfy the original code's check equations.

In the disclosed embodiments, the auxiliary equations are derived from the check equations so that a code word of the LDPC code satisfying the check equations also satisfies all the auxiliary equations. For example, in some embodiments, each auxiliary equation comprises a linear combination of multiple check equations, calculated in the underlying Galois Field (GF). In an embodiment, the linear combination comprises summing multiple check equations, or bitwise XORing in case of a binary code.

Note that satisfying the auxiliary equations does not guarantee convergence to a valid code word. By careful design, however, the probability of false termination, i.e., having the variables satisfying the auxiliary equations but not the check equations, can be set sufficiently small for most practical applications. For example, in some embodiments, by deriving K auxiliary equations from the check equations, the probability of false termination is a non-increasing function of K, and can be shown to be on the order of $1/(2^K)$.

In some embodiments, the ECC comprises a quasi-cyclic (QC)-LDPC code whose parity-check matrix comprises multiple L-by-L sub-matrices, wherein each sub-matrix comprises a zero matrix or a circulant matrix. A circulant matrix can be constructed, for example, by circularly shifting an identity matrix. A row of sub-matrices in the parity-check matrix is also referred to herein as a block row.

In such embodiments, an auxiliary matrix can be derived by summing together the block rows of the parity-check matrix. e.g., to produce an auxiliary matrix having a single block row. Summing block rows together means summing rows having the same row number in different block rows. For example, the $k^{th}$ rows are summed over the block rows to derive the $k^{th}$ auxiliary equation. In some embodiments, multiple rows of the single block row matrix are further summed to reduce the number of auxiliary equations. In an embodiment, the resulting auxiliary matrix is a quasi-cyclic matrix that can be represented efficiently in memory.

In some embodiments, evaluating the auxiliary equations is carried out by calculating an auxiliary syndrome $S'=H'·C$, wherein C denotes the state of the variable nodes. The decoding is regarded as converged when C satisfies the auxiliary equations, i.e., when $S'=0$. In some embodiments, the decoder initializes the auxiliary syndrome $S'$ using the channel output d by calculating $S'=H'·d$. The decoder iteratively updates $S'$ using the expression $S'=S'+H'·F$ until meeting the condition $S'=0$, wherein F is a vector comprising the recently flipped bits in the variable nodes.

System Description

Figure 1:
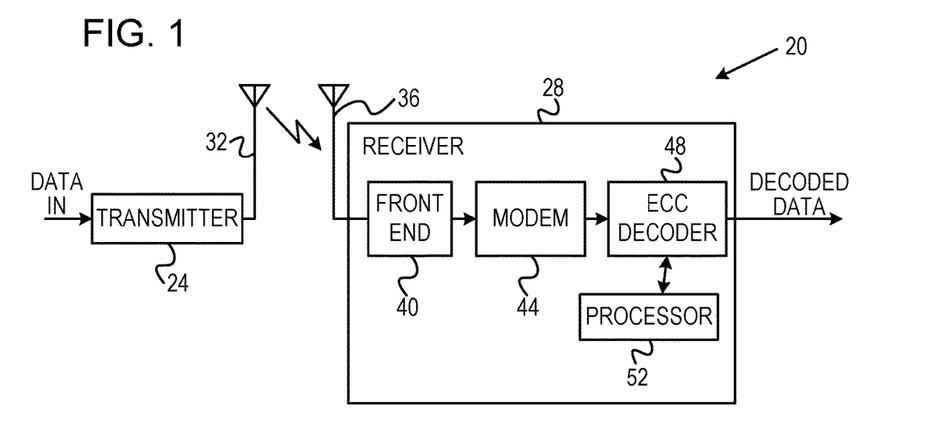
FIG. 1 is a block diagram that schematically illustrates a communication system that uses Error Correction Coding (ECC), in accordance with an embodiment that is described herein.

FIG. 1 is a block diagram that schematically illustrates a wireless communication system 20 that uses error correction coding, in accordance with an embodiment that is described herein. System 20 comprises a transmitter 24, which transmits data to a receiver 28. The transmitter accepts input data, encodes the data with a certain ECC (the encoded data is also referred to as a code word), modulates the encoded data in accordance with a certain modulation scheme, converts the modulated digital signal to an analog signal, up-converts the analog signal to a suitable Radio frequency (RF), and transmits the RF signal toward the receiver using a transmitting antenna 32.

In receiver 28, a receiving antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data (i.e., the sent code word) is demodulated by a modem 44, and the ECC is decoded by an ECC decoder 48. Decoder 48 is controlled by a processor 52. The structure and functionality of decoder 48 are described in detail below. By decoding the ECC, decoder reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

Figure 2:
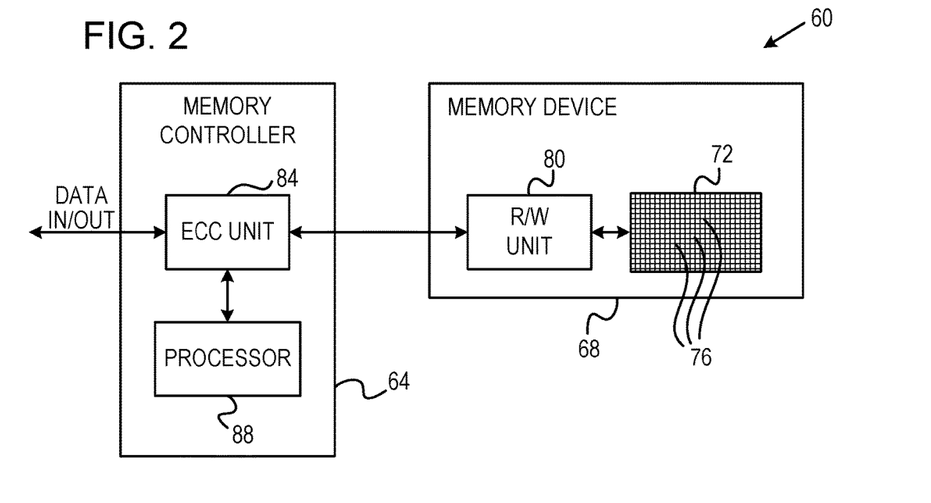
FIG. 2 is a block diagram that schematically illustrates a memory system that uses Error Correction Coding (ECC), in accordance with an embodiment that is described herein.

FIG. 2 is a block diagram that schematically illustrates a data storage system 60 that uses error correction coding, in accordance with an alternative embodiment that is described herein. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. Unit 84 is controlled by a processor 88. The structure and functionality of unit 84 are described in detail below. The ECC used in systems 20 and 60 may comprise, for example, a Low Density Parity Check (LDPC) code or a Quasi-cyclic (QC)-LDPC code, as well as various other types of ECC that are decoded iteratively.

The ECC decoding schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

Iterative Decoder Architecture

Figure 3:
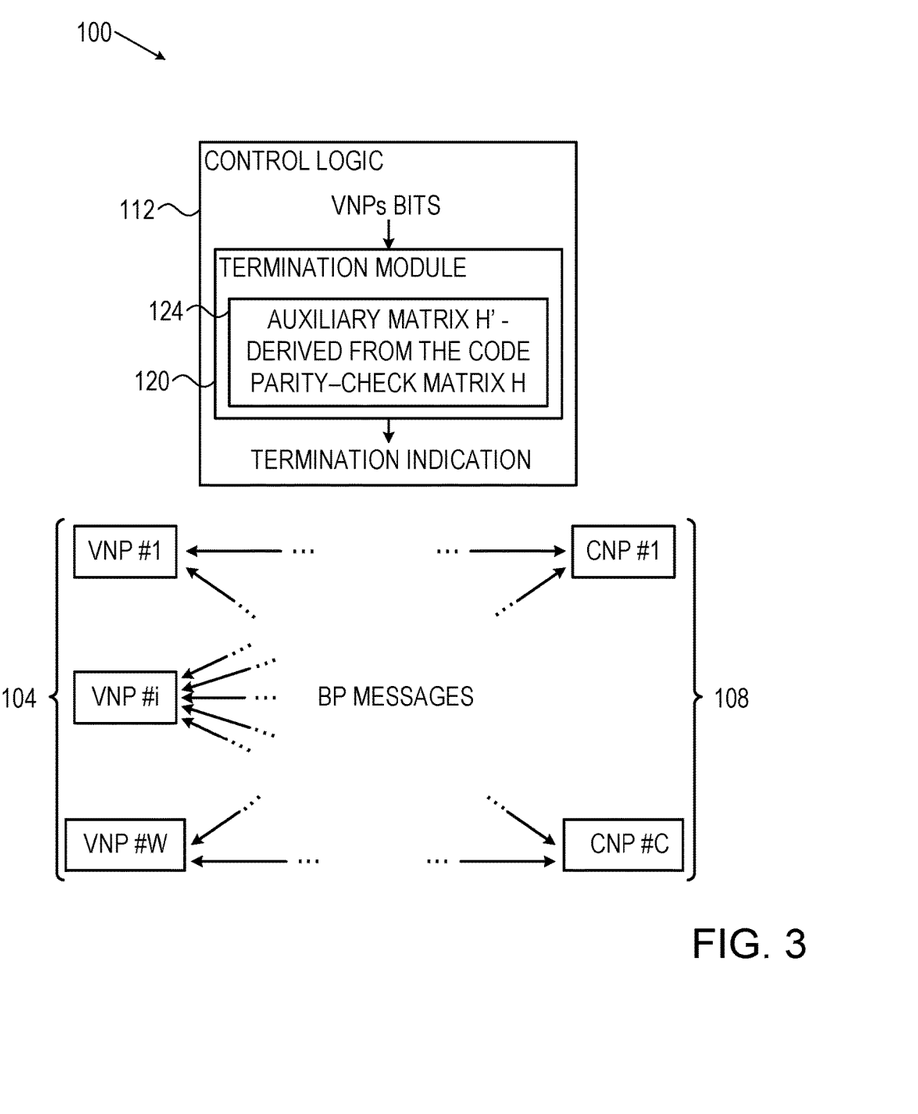
FIG. 3 is a block diagram that schematically illustrates a LDPC decoder, in accordance with an embodiment of the present invention.

FIG. 3 is a block diagram that schematically illustrates an LDPC decoder 100, in accordance with an embodiment of the present invention. Decoder 100 can be used to implement decoder 48 of FIG. 1 above, or ECC unit 84 of FIG. 2 above. Decoder 100 accepts as input valid ECC code words, or other input that comprises corrupted code words (e.g., by noise) and therefore contain errors. In other words, the input to the decoder may not always comprise valid code words of the ECC. In the description that follows, the input to the decoder is also referred to as the channel output. The ECC decoder decodes the input while attempting to correct these errors, so as to reconstruct the data conveyed in the code words. In a typical implementation, each code word comprises on the order of several hundred to several thousand bits, although any other suitable code word size can be used.

The LDPC code in question is defined by a set of M check equations, which are defined over a set of V variables (e.g., bits for a binary LDPC code). Decoder 100 comprises a set of W Variable Node Processors (VNPs) 104 denoted VNP#1 . . . VNP#W, and a set of C Check Node Processors (CNPs) 108 denoted CNP#1 . . . CNP#C. Each variable node may be associated with a respective VNP, and each check equation may be associated with a respective CNP.

VNPs 104 and CNPs 108 are connected by arcs (shown as arrows in the figure, in accordance with the structure of the code. The VNP assigned to each variable (or variable node) is connected to the CNPs that are assigned to the check equations (or check node) in which that variable appears. Since the LDPC code is sparse (i.e., the code has a sparse parity-check matrix), each CNP is typically connected only to a small subset of the VNPs. In other words, only a small number of variables appear in each of the check equations. As long as the decoder has not yet converged to a valid code word, at least one check equation is still unsatisfied.

The check equations of the LDPC ECC are defined over some underlying Galois Field (GF). A vector whose elements are the outcome of evaluating the check equations is also referred to as a syndrome. The description that follows refers mainly to binary LDPC codes, in which case the variable nodes are also referred to as bit nodes. The disclosed techniques, however, are similarly applicable to non-binary codes, as well. In a binary LDPC code, each check equation calculates the parity over the binary variables participating in that equation, or equivalently sums (or XORs) the respective variables over GF(2).

In the disclosed embodiments, decoder 100 carries out an iterative Message-Passing (MP) decoding scheme. In an example MP scheme, VNPs 104 are initialized with the respective bit values of the channel output. The VNPs and CNPs exchange messages with one another over the arcs that connect them. Based on the messages received from the CNPs and on the channel output, VNPs may adapt their bit values. This scheme is sometimes referred to as Belief Propagation (BP), and the messages exchanged between the VNPs and CNPs are sometimes referred to as BP messages. The messages from the CNPs to the VNPs are referred to herein as CNP messages, and the messages from the VNPs to the CNPs are referred to herein as VNP messages.

Decoder 100 further comprises a control logic module 112 that manages and coordinates the operations carried out by the VNPs and CNPs. For example, among other tasks, control logic 112 manages the scheduling of the variable and check nodes. Control logic 112 comprises a termination module 120 that handles the decoding convergence using auxiliary equations defined by an auxiliary matrix 124 denoted H'. The auxiliary matrix H' is derived from the parity-check matrix H of the ECC, and by design comprises a much smaller number of equations. The number of the auxiliary equations determines a tradeoff between accuracy and complexity. Thus, using a larger number of auxiliary equations decreases the probability of converging to a state that is not a valid code word.

ECC decoder 48 of FIG. 1, ECC unit 84 of FIG. 2 and ECC decoder 100 of FIG. 3 may be implemented in software, in hardware, or using a combination of hardware and software elements. In some embodiments, decoder 48, unit 84 and/or decoder 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48, unit 84 and/or decoder 100 (including VNPs 104, CNPs 108, and control logic 112) are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements.

In the context of the present patent application and in the claims, the term "logic circuitry" collectively refers to any decoder functionality outside VNPs 104, i.e., CNPs 108, and control logic 112 in decoder 100.

In some embodiments, the iterative decoding process scans variable and check nodes, or groups thereof in some scheduling order, e.g., sequentially. A full scan over the variable and check nodes is referred to herein as a decoding iteration, or simply "iteration" for brevity. An example of an iterative process of this sort is described in the paper by Cui et al., in "Efficient Decoder Design for High-Throughput LDPC decoding," IEEE Asia Pacific Conference on Circuits and Systems, November, 2008, which is incorporated herein by reference. Alternatively, any other suitable process can be used.

Based on the code structure and decoding scheduling, each CNP sends messages to its connected VNPs and receives messages from its connected VNPs. The message value sent from a given CNP to a given VNP comprises a predefined CNP function computed over the respective CNP state and the VNP messages received by that CNP. For example, in bit flipping decoding, the CNPs function comprises a parity-check sum function (also referred to as a syndrome calculation function), which is related to the check equations.

Similarly, when the turn of each variable node arrives, the respective VNP receives messages from its connected CNPs and sends to these CNPs updated messages. The message value sent from a given VNP to a given CNP comprises a predefined VNP function computed over the incoming CNP messages and the VNP state. The set of messages typically comprises the most updated messages received in the given VNP from the CNPs other than the given CNP, e.g., during the most recent decoding iteration.

VNPs 104 can use any suitable VNP function for calculating the message value to be sent to its connected CNPs. For example, when decoder 100 comprises a bit flipping decoder, the VNP function comprises evaluating the VNP bit value, e.g., by conditionally flipping the bit value based on the number of the unsatisfied check equations in which the bit value appears.

Upon receiving a new message from a given VNP, the CNP typically replaces the previous message received from this VNP, and re-evaluates its state to reflect the newly-received message. VNPs update similarly upon receiving the CNPs messages.

Although we refer mainly to bit flipping decoding, other suitable decoding schemes such as extrinsic message passing or a-posteriori massage passing schemes can also be used.

Control logic 112 of decoder 100 may scan the variable and check nodes in any suitable order. In the present example, we mainly refer to a scanning scheme in which an outer loop scans the check nodes and an inner loop scans the variable nodes for the currently-scanned check node. Such a scheduling order is sometimes referred to as "serial C" or row-layered.

In some embodiments, the parity-check matrix H of a special type of LDPC codes, which are referred to as Quasi-Cyclic (QC)-LDPC codes, comprises multiple sub-matrices, each comprising a zero matrix or a circulant matrix, which may be derived, for example, by shifting the rows or columns of an identity matrix cyclically. Such techniques are described, for example, by Hocevar, in "LDPC code construction with flexible hardware implementation," IEEE International Conference on Communications, ICC '03, May, 2003, which is incorporated herein by reference.

In some embodiments the variable nodes and the check nodes are partitioned into groups that also referred to as variable layers and check layers, respectively. A circulant sub-matrix of H connects between L variable nodes and L check nodes of respective variable layer and check layer.

Consider, for example, a QC-LDPC code whose parity-check matrix comprises L-by-L sub-matrices. In some embodiments, the QC-LDPC decoder processes one or more circulant sub-matrices in a block row (or block column) of H in parallel. For example, in serial C scheduling, the decoder evaluates in parallel L check equations with respect to one or more variable layers, in accordance with the structure of the parity-check matrix H.

Efficient Decoding Convergence

In the disclosed embodiments, detecting the iterative decoding convergence is based on evaluating the auxiliary equations defined by the auxiliary matrix H', rather than evaluating the check equations defined by the parity-check matrix H. Equivalently, given the variable nodes state C, the decoder evaluates an auxiliary syndrome $S'=H'\cdot C$ instead of evaluating the code syndrome $S=H\cdot C$. The candidate code word C is assumed to be a valid code word when $S'=H'\cdot C=0$. Since H' has a much smaller number of equations than H, calculating S' is much more efficient than calculating S in terms of hardware complexity, processing time and power consumption.

The auxiliary matrix H' can be derived from the code's parity-check matrix H in various ways. In some embodiments, each row of H' comprises a linear combination of multiple rows of H. For example, a row of H' can be derived by summing (or XORing in case of a binary code) multiple rows of H. Note that by such derivation of H', the equality $S=H\cdot C=0$ implies also the equality $S'=H'\cdot C=0$, i.e., if C satisfies the check equations then C also satisfies each of the auxiliary equations. The other direction, however, is generally not true, i.e., $S'=0$ does not imply $S=0$, and therefore C satisfying the auxiliary equations is not necessarily a valid code word.

In some embodiments, H' can be derived from H so that if $S'=H'\cdot C=0$ then C is a valid code word with sufficiently high probability. For example, it can be shown that if the number of rows of H' equals K, then the probability for misclassifying C as a valid code word is given by approximately $2^{-K}$. For example, if H' comprises ten rows (i.e., the rows in H' are derived from H) then if C satisfies the auxiliary equations defined by H' then the probability of correctly classifying C as a valid code word is given by 1−1/1024.

Combining rows of H to derive H' can be done in any suitable manner. For example, the rows of H' can be derived by summing groups of successive rows in H'. As another example, even and odd rows in H' can be derived by summing even and odd rows in H, respectively. As yet another example, a single row in H can be used to derive two or more different rows in H'. In some embodiments, H' is derived from a partial subset of the rows of H. In other words, it is unnecessarily to use all of the rows of H in constructing the rows of H'. In addition, at least one auxiliary equation can be derived by copying a respective check equation (rather than summing multiple check equations).

When the parity-check matrix H defines a QC-LDPC code, deriving H' from H can be carried out at the level of the sub-matrices of H. Consider for example a QC-LDPC code whose parity-check matrix H comprises M1 block rows and N1 block columns of L-by-L sub-matrices. Such a parity-check matrix defines M1·L check equations that are defined over N1·L variables. In some embodiments, H' is derived by summing together all the block rows of H, which results in a single block row matrix H' of L auxiliary equations.

In some embodiments, H' is calculated from H offline and stored in a nonvolatile storage. In other embodiments H' is calculated from H and stored, e.g., at decoder initialization.

In an example embodiment of a QC-LDPC decoder, H comprises M1=12 block rows, N1=24 block columns, and the sub-matrices of H are 81-by-81, i.e., L=81. In the present example, H' is derived from H by first summing together the block rows of H to create an intermediate matrix of 81 rows and 24·81=1944 columns. Then, H' is derived by partitioning the intermediate matrix to three block rows of 27-by-27 blocks, and summing together these three block rows, which results in H' having 27 rows of length 1944.

By terminating the decoding when C satisfies the set of 27 auxiliary equations defined by H', the probability that C does not satisfy all of the check equations in H, (i.e., the probability of falsely declaring C to be valid code word) is given by approximately $2^{-27} \approx 7.4E-9$, which is sufficiently small for most practical applications.

Note that since H is a quasi-cyclic matrix, the matrix H' in the example above is also quasi-cyclic and therefore can be represented efficiently in memory. In the present example H' comprises one block row and 24·3 block columns of 27-by-27 sub-matrices. Moreover, every three consecutive 27-by-27 sub-matrices share the same quasi-cyclic pattern. Therefore, it is sufficient to store in memory only 27 bits, i.e., the first row or column of one sub-matrix to represent three 27-by-27 sub-matrices. The total storage space for H' is therefore given by 24·27=648 bits.

Figure 4:
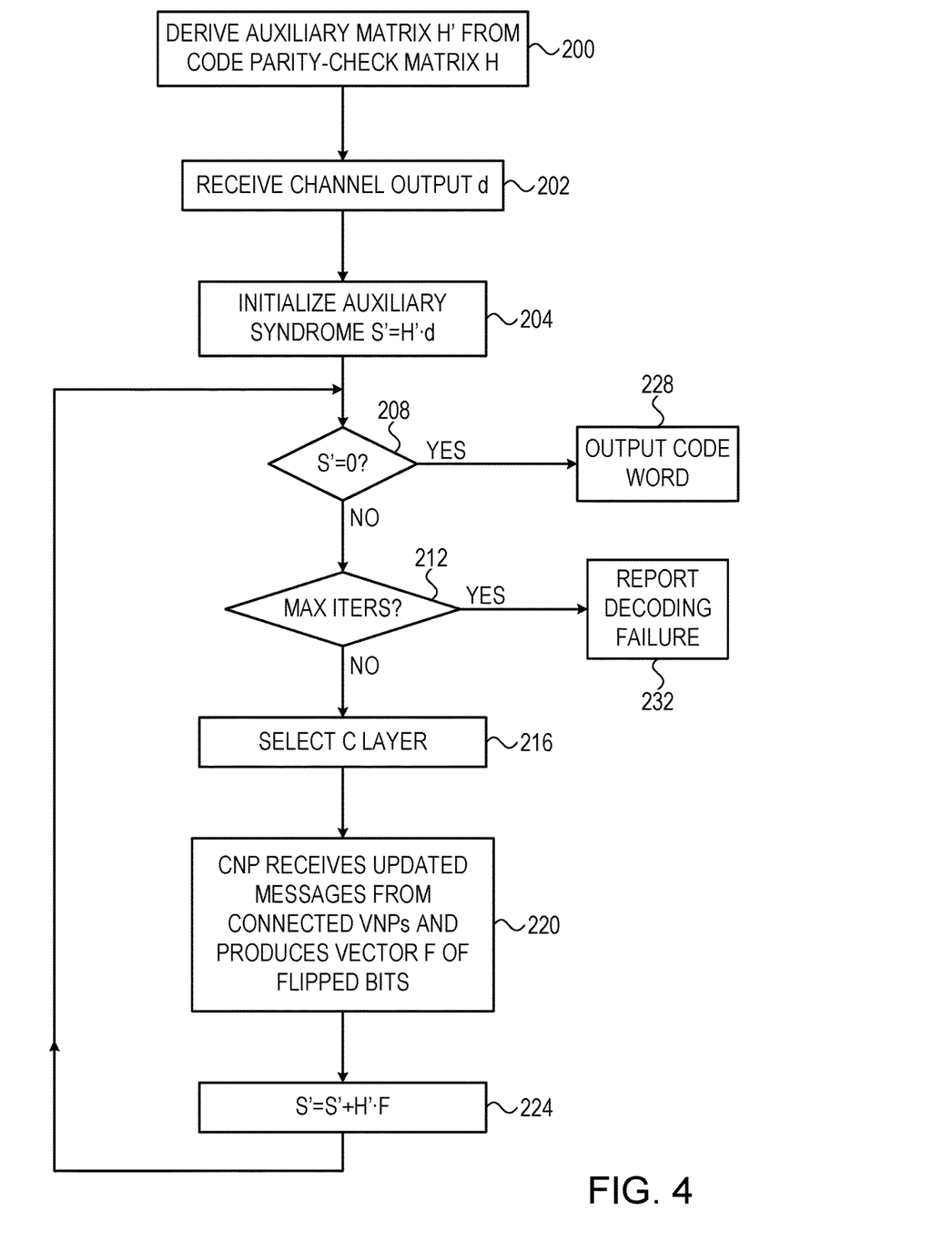
FIG. 4 is a flow chart that schematically illustrates a method for iterative LDPC decoding with fast convergence, in accordance with an embodiment that is described herein.

FIG. 4 is a flow chart that schematically illustrates a method for iterative LDPC decoding with fast convergence, in accordance with an embodiment that is described herein. The present example refers to a Message-Passing based QC-LDPC decoder, having the same or similar structure as decoder 100 of FIG. 3 above.

At a matrix-derivation step 200, the decoder derives the auxiliary matrix H' from the LDPC parity-check matrix H, e.g., by summing multiple rows of H to derive each row of H', as described above. In some embodiments, H' is derived from H' and stored beforehand, and in this case the decoder skips step 200. At a reception step 202, the decoder receives as input the channel output d, and uses d to initialize the variable node bits. At a syndrome initialization step 204, the decoder initializes an auxiliary syndrome S' by calculating S'=H'·d.

At a convergence check step 208, the decoder checks whether the auxiliary syndrome equals zero. If at step 208 S'=0, i.e., the variable node bits are assumed to comprise a valid code word, and the decoder outputs the variable node bits as a valid code word, at an output step 228 and the method terminates. when at step 208 S' is non-zero, the decoder checks whether a maximal number of iterations have been processed, at an iteration management step 212, and if so, indicates a decoding failure, at a failure reporting step 232 and the method terminates. Otherwise, the decoder proceeds to a layer selection step 216, in which the decoder selects a subsequent C layer to be processed.

At a flipped bits generation step 220, the CNP assigned to process the C layer selected at step 216 receives updated messages from its connected VNPs, including an updated state of the variable node bits, and produces a vector F of the recently flipped bits. The CNP updates S', at a syndrome updating step 224, by calculating S'=S'+H'·F. Following step 224, the decoder loops back to step 208 to check for convergence using the updated S'. Note that in alternative embodiments in which the variables are not binary but are rather defined in some Galois Field (GF), the vector F holds the difference between the previous variables and the recently updated variables in the underlying GF.

The embodiments described above are given by way of example, and other suitable embodiments can also be used. For example, although typically a fixed number of check equations are used to derive each auxiliary equation, this is not mandatory. In alternative embodiments, each auxiliary equation can be derived for a different number of check equations.

The functionality partitioning between the CNPs and other elements of the decoder as described above is given by way of example, and other suitable partitioning can also be used. For example, functionality carried out by the CNP as described above can be carried out, in alternative embodiments, by (or in combination with) other elements of the decoder such as control logic 112.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A decoder, comprising:
   one or more Variable-Node Processors (VNPs), configured to hold multiple values of respective variables; and
   logic circuitry, which is configured to:
      receive a code word of an Error Correction Code (ECC), which is representable by a set of check equations, initialize the variables held by the one or more variable node processors from the received code word, perform a sequence of iterations such that each iteration involves processing of at least some of the variables held by the one or more variable node processors, based on corresponding check equations in which the variables appear, hold one or more auxiliary equations, each derived from a plurality of the check equations, such that when the plurality of check equations from which a specific auxiliary equation is derived are satisfied, the specific auxiliary equation is also satisfied, wherein a number of the auxiliary equations is smaller than a number of the check equations, during the sequence of iterations, evaluate whether current values of the variables satisfy the auxiliary equations, and in response to detecting that the variables satisfy the auxiliary equations, terminate the sequence of iterations and output the variables as the decoded code word, wherein the logic circuitry evaluates whether the current values of the variables satisfy the auxiliary equations by initializing an auxiliary syndrome based on the received code word, updating the auxiliary syndrome based on changes in the variables and determining when the auxiliary syndrome has a value of zero, and wherein the auxiliary equations are represented by a quasi-cyclic matrix, and the logic circuitry holds the matrix in a reduced storage space based on knowledge of the quasi-cyclic attributes of the quasi-cyclic matrix.

2. The decoder according to claim 1, wherein the one or more auxiliary equations comprise linear combinations of two or more of the check equations.

3. The decoder according to claim 1, wherein the ECC comprises a Quasi-Cyclic (QC) Low Density Parity Check (LDPC) code whose check equations are organized in a parity-check matrix that comprises multiple block rows of L-by-L sub-matrices, and wherein the one or more auxiliary equations include an auxiliary equation comprising a linear combination of two or more check equations that belong to different respective block rows.

4. The decoder according to claim 1, wherein the logic circuitry is configured to calculate an auxiliary syndrome corresponding to the auxiliary equations, and to detect that the variables satisfy the auxiliary equations by detecting that the auxiliary syndrome equals zero.

5. The decoder according to claim 4, wherein the VNPs are configured to define the values of the variables in a Galois Field (GF), and wherein the logic circuitry is configured to update the auxiliary syndrome based on a vector of recently updated variables.

6. The decoder according to claim 1, wherein the code word is received by the logic circuitry from a memory device.

7. The decoder according to claim 1, wherein the code word is received by the logic circuitry in a communication signal.

8. The decoder according to claim 1, wherein each of the auxiliary equations is derived from a fixed number of the check equations.

9. A method comprising:

receiving in a decoder, a code word of an Error Correction Code (ECC), which is representable by a set of check equations;

initializing variables held by the decoder, from the received code word;

performing a sequence of iterations such that each iteration involves processing of at least some of the variables held by the decoder, based on corresponding check equations in which the variables appear;

holding one or more auxiliary equations derived from the check equations, wherein a number of the auxiliary equations is smaller than a number of the check equations, and wherein the auxiliary equations are characterised in that when the plurality of check equations from which a specific auxiliary equation is derived are satisfied, the specific auxiliary equation is also satisfied;

during the sequence of iterations, evaluating whether current values of the variables satisfy the auxiliary equations; and in response to detecting that the variables satisfy the auxiliary equations, terminating the sequence of iterations and outputting the variables as the decoded code word, wherein evaluating whether the current values of the variables satisfy the auxiliary equations comprises initializing an auxiliary syndrome based on the received code word, updating the auxiliary syndrome based on changes in the variables and determining when the auxiliary syndrome has a value of zero, and wherein the auxiliary equations are represented by a quasi-cyclic matrix, and holding one or more auxiliary equations comprises holding the quasi-cyclic matrix in a reduced storage space based on knowledge of the quasi-cyclic attributes of the quasi-cyclic matrix.

10. The method according to claim 9, wherein holding the auxiliary equations comprises holding an auxiliary equation comprising a linear combination of two or more of the check equations.

11. The method according to claim 9, wherein the ECC comprises a Quasi-Cyclic (QC) Low Density Parity Check (LDPC) code whose check equations are organized in a parity-check matrix that comprises multiple block rows of L-by-L sub-matrices, and wherein holding the auxiliary equations comprises holding an auxiliary equation comprising a linear combination of two or more check equations that belong to different respective block rows.

12. The method according to claim 9, wherein evaluating the auxiliary equations comprises calculating an auxiliary syndrome corresponding to the auxiliary equations, and wherein detecting that the variables satisfy the auxiliary equations comprises detecting that the auxiliary syndrome equals zero.

13. The method according to claim 12, wherein the values of the variables nodes are defined in a Galois Field (GF), and wherein evaluating the auxiliary equations comprises updating the auxiliary syndrome based on a vector of recently updated variables.

14. The method according to claim 9, wherein receiving the code word comprises receiving from a memory device.

15. The method according to claim 9, wherein receiving the code word comprises receiving the code word in a communication signal.

16. The method according to claim 9, wherein each of the auxiliary equations is derived from a fixed number of the check equations.

* * * * *